United States Patent [19]
Adishian et al.

[11] Patent Number: 6,157,258
[45] Date of Patent: Dec. 5, 2000

[54] HIGH FREQUENCY POWER AMPLIFIER

[75] Inventors: Gary C. Adishian, Scottsville; Daniel J. Lincoln, Brockport; Robert Sengillo, Jr.; John Cunliffe, both of Rochester, all of N.Y.

[73] Assignee: Ameritherm, Inc., Scottsville, N.Y.

[21] Appl. No.: 09/270,506

[22] Filed: Mar. 17, 1999

[51] Int. Cl.$^7$ ............................... H03F 3/68; H03F 3/26; H03F 3/18
[52] U.S. Cl. ......................... 330/295; 330/276; 330/264
[58] Field of Search ................ 330/124 R, 295, 330/310, 311, 276, 269, 264

[56] References Cited

U.S. PATENT DOCUMENTS

| | | | |
|---|---|---|---|
| 3,652,947 | 3/1972 | Hollingsworth | 330/276 |
| 3,714,597 | 1/1973 | Reynolds | 330/276 |
| 4,631,492 | 12/1986 | Magarshack et al. | 330/295 |
| 5,208,554 | 5/1993 | Endler et al. | 330/295 |
| 5,420,537 | 5/1995 | Weedon et al. | 330/269 |
| 5,477,188 | 12/1995 | Chawla et al. | 330/269 |
| 5,789,979 | 8/1998 | Kumar et al. | 330/149 |
| 5,952,886 | 9/1999 | Buer et al. | 330/295 |

*Primary Examiner*—Robert Pascal
*Assistant Examiner*—Patricia T. Nguyen
*Attorney, Agent, or Firm*—Mintz, Levin, Cohn, Ferris, Glovsky and Popeo, P.C.

[57] ABSTRACT

A power amplifier that provides wide-band, high efficiency, high voltage, HF power amplification over a large dynamic operating range. In one embodiment, the power amplifier includes a driver amplifier, an intermediate power amplifier comprising a coherently combined array of two transistors, and a final power amplifier comprising a coherently combined array of multiple transistors. The two stage driver amplifier drives the intermediate power amplifier, which drives the final power amplifier. Preferably, because of the inherent linearity, dynamic range, and power limiting requirements, the driver amplifier includes two transistor devices that are of the silicon power bipolar type, operating in class A with classic common-emitter circuit configuration. Preferably, the transistors used in the intermediate power amplifier and the final power amplifier are MOSFETS operating in a non-classic DC grounded-drain, RF common source circuit configuration.

62 Claims, 5 Drawing Sheets

HIGH FREQUENCY POWER AMPLIFIER

BACKGROUND OF THE INVENTION

1. Field of the Invention

The present invention relates generally to power amplifiers, and more specifically to high frequency, high efficiency, Wideband, multi-kilowatt power amplifiers.

2. Related Art

A power amplifier takes a low power RF signal and amplifies it to create a high power RF signal. A high frequency (HF) power amplifier amplifies RF signals having a frequency in the range of 3 to 30 of millions of hertz (MHz). Specific applications of a HF power amplifier include RF induction and dielectric heating and plasma etching deposition, cleaning and ashing processes.

A disadvantage of conventional high efficiency, HF power amplifiers is that they operate only over a narrow frequency band (i.e., much less than one octave bandwidth). That is, they do not provide instantaneous amplification over a wide bandwidth. Additionally, their relatively low power conversion efficiencies require impracticably large primary power inputs to generate multi-kilowatts of RF power. What is therefore desired is a HF power amplifier that overcomes these disadvantages.

SUMMARY OF THE INVENTION

The power amplifier according to the present invention provides wideband, high efficiency, high voltage, HF power amplification over a large dynamic operating range. In one embodiment, the power amplifier includes three stages: a driver amplifier, an intermediate power amplifier comprising a coherently combined array of two transistors, and a final power amplifier including a coherently combined array of multiple (two or more) transistors. Preferably, the final power amplification stage includes a coherently combined array of six transistors, however the invention is not limited to any particular number of transistors. The driver amplifier drives the intermediate power amplifier, which drives the final power amplifier.

Preferably, because of the inherent linearity, dynamic range, and power limiting requirements, the driver amplifier includes two transistor devices that are of the silicon power bipolar type, operating in class A with classic commonemitter circuit configuration. Preferably, the transistors used in the intermediate power amplifier and the final power amplifier are metal-oxide semiconductor field effect transistors (MOSFETS) operating in a non-classic DC grounded-drain, RF common source circuit configuration.

Power amplification transistor technology device types, bipolar junction transistors (BJTs) and field effect transistors (FETs), are distributed in the cascade of stages for an advantageous combination of dynamic compatibility over the 100:1 (20 dB) operating power output range between 20 W and 2000 W. Specifically, the best necessary "current balance" (sharing of current) among the multiple FETs in the final power stage is optimized by the use of BJTs, with their superior linear dynamic range, in the 10 W 40 dB driver amplifier. This preserves an optimum harmonic suppression fidelity in both the positive and negative halves of the driving signal applied to the final push-pull power stage. This directly promotes the balance necessary on each half-cycle for coherent power combining of the multiple FETs in the final power stage.

Further features and advantages of the present invention, as well as the structure and operation of various embodiments of the present invention, are described in detail below with reference to the accompanying drawings.

BRIEF DESCRIPTION OF THE FIGURES

The accompanying drawings, which are incorporated herein and form part of the specification, illustrate the present invention and, together with the description, further serve to explain the principles of the invention and to enable a person skilled in the pertinent art to make and use the invention. In the drawings, like reference numbers indicate identical or functionally similar elements. Additionally, the left-most digit(s) of a reference number identifies the drawing in which the reference number first appears.

DETAILED DESCRIPTION OF THE PREFERRED EMBODIMENTS

Figure 1:
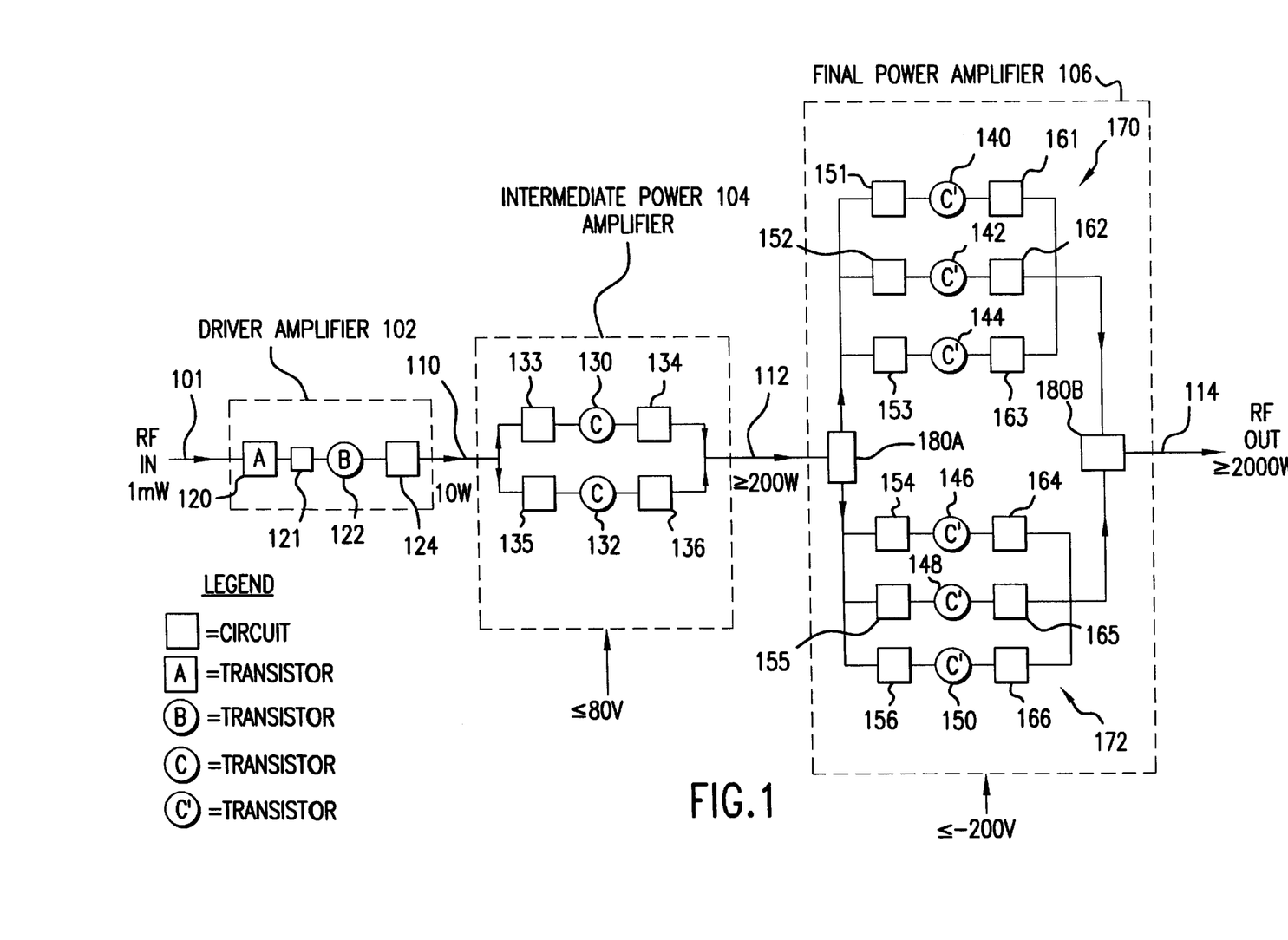
FIG. 1 is a block functional diagram of a power amplifier according to one embodiment of the present invention.

FIG. 1 illustrates a power amplifier 100 according to one embodiment of the present invention. Power amplifier 100 includes three cascaded stages 102–106 of power amplification. Stage 102 is a referred to as a driver amplifier, stage 104 is referred to as an intermediate power amplifier, and stage 106 is referred to as a final power amplifier.

Driver amplifier 102 receives a low power (for example, 1 milliwatt) RF input signal 101, amplifies the signal 101, and drives intermediate power amplifier 104. Driver amplifier 102 operates from a relatively low DC voltage of 24 volts. In one embodiment, driver amplifier 102 is a two stage driver with 40 dB of gain. Thus, it produces a 10 watt output signal 110 from a 1 mW input signal 101.

Perferably, driver amplifier 102 includes a series-connected cascade of two transistor devices 120 and 122. It also includes RF circuits 121 and 124, which provide impedance transformation (matching) functions. Preferably, transistor devices 120 and 122 are of the silicon power bipolar type, operating in class A with the classic common-emitter circuit configuration. It is, however, contemplated that other transistor types could be utilized. Preferably, transistor device 120 is an RF-market linear power hybrid device, such as the Motorola CA 2832C device, and transistor device 124 is a discrete device.

Intermediate power amplifier (IPA) 104 amplifies the output 110 of driver amplifier 102 and drives the final power amplifier 106. In one embodiment, IPA 104 includes a coherently combined array of two field effect transistors (FETs) 130 and 132. FET 130 and FET 132 operate at a relatively low DC voltage of 80 volts for optimum interstage impedance matching and "drive" power limiting of final power amplifier 106. Circuits 133, 134, 135, and 136 are inter-stage matching circuits. The output 112 of IPA 104 is greater than 200 watts with greater than 13 dB of gain. Preferably, FET 130 and 132 are DC-market type TO-247 packaged, high breakdown voltage (1 kV), single large chip, high conductivity (12 A) MOSFETS operating in a "non-classic" DC grounded drain, RF common source configuration. This configuration provides enhanced transistor device thermal reliability while preserving the advantageous stable high gain properties of the classic common source grounded source configuration.

In one embodiment, final power amplifier 106 includes a coherently combined array of six high voltage, high conductivity, power MOSFET transistors 140–150 of the same type as described in the IPA. In other embodiments, final power amplifier 106 includes more than or less than six transistors. With the six transistor configuration, final power amplifier 106 provides a greater than 2 kilowatt output at greater than 85% efficiency with 10 dB of gain at 200 VDC over the entire two-thirds octave 10–15 MHz band. In of embodiment MOSFETS 140–150 are divided into two groups 170 and 172 of three devices each, with the collective outputs on precisely in parallel, but with a degree of necessary inter-device isolation provided from the individual impedance matching and isolation input circuits 151–156 and the individual impedance matching and isolation output circuits 161–166.

The two groups 170 and 172 are coherently combined with a set of two wideband planar-magnetic loaded transmission-line transformers (baluns) 180A and 180B. This permits both push-pull operation of each three-FET group 170 and 172, providing classic suppression of the associated even order harmonics over the wide band and also providing a necessary impedance transformation. Therefore, the 6-FET array operates in a quasi-parallel push-pull configuration. Preferably, each MOSFET 140–150 are DC-market type TO-247 packaged, high breakdown voltage (1 kV), single large chip, high conductivity (12 A) MOSFETS operating in a "non-classic" DC grounded drain, RF common source configuration. This configuration provides enhanced device thermal reliability while preserving the advantageous stable high gain properties of the classic common-source grounded-source configuration.

Figure 2:
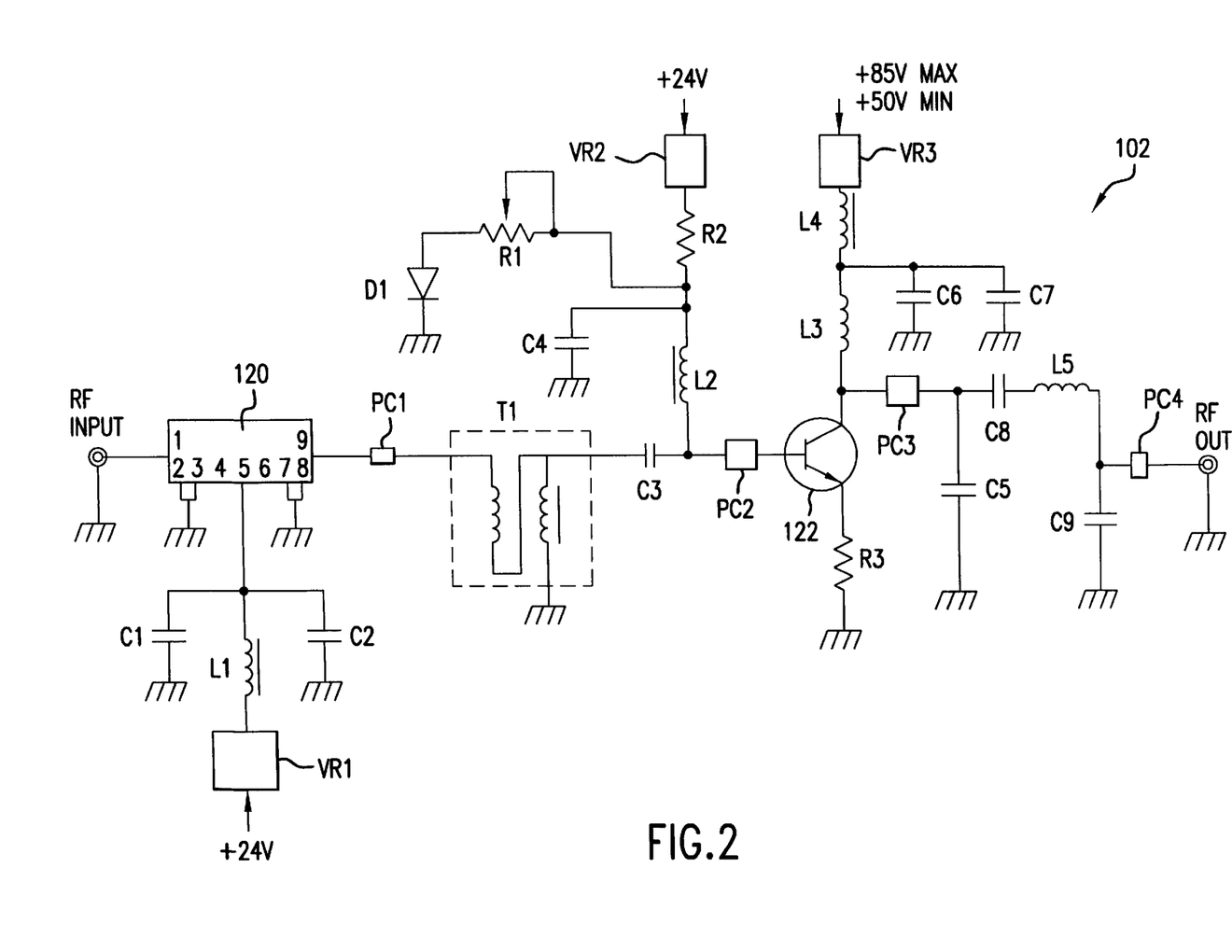
FIG. 2 is a schematic diagram of one embodiment of driver amplifier.

FIG. 2 is a schematic diagram of one embodiment of driver amplifier 102. As discussed above, driver amplifier 102 includes two transistors 120 and 122. Transistor 120 is a linear class A, power hybrid or Darling bi-polarjunction transistor (BJT). Transistor 122 is linear class A power DC market BJT. The preferred values for the various circuit elements will now be described. Low frequency bypass capacitor C1 is preferably 1 microfarad (uF). RF bypass and DC blocking capacitors C2, C3, C4, and C6 are preferably 0.1 microfarad (uF). L-C resonator capacitor C5 is preferably 390 F. Low frequency bypass capacitor C7 is preferably 1 microfarad (uF). L-C resonator capacitor C8 is preferably 1 nanofarad (nF) and impedance matching capacitor C9 is preferably 300 picofarads (pF).

Figure 3A:
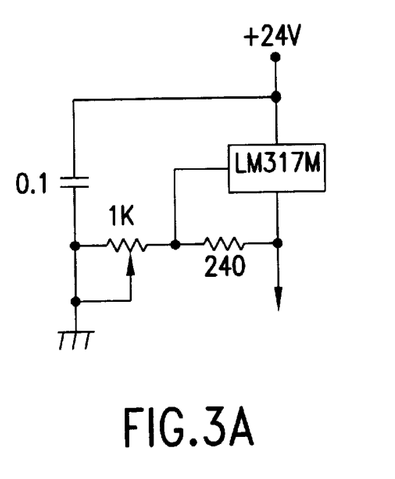
FIGS. 3A, 3B, and 3C illustrate voltage regulators VR1, VR2, and VR3, respectively.
Figure 3B:
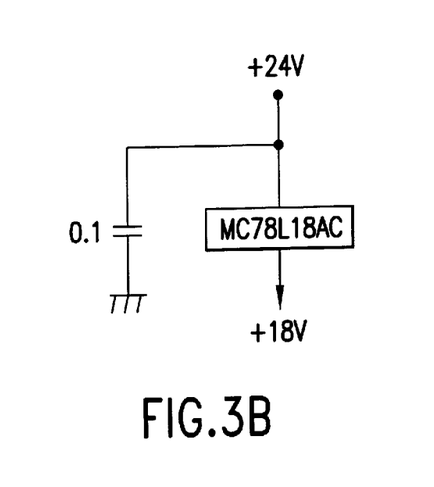
Figure 3C:
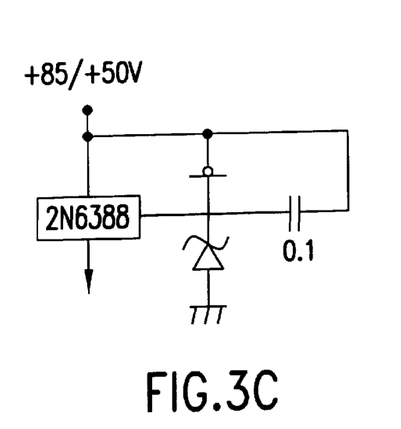

RF choke inductors L1 and L4 are preferably 56 microhenries (uH). RF choke inductor L2 is preferably 7 uH. L-C resonator inductors L5 and L3 are preferably 0.6 uH. Preferably, isolation resistor R1 is 10 ohms; bias current source resistor R2 is 360 ohms; and negative DC/RF feedback resistor R3 is 1 ohm. Circuit elements PC1, PC2, PC3, and PC4 are each preferably a 1.0 inch, 0.375 inch width pc conductor. Voltage regulators VR1, VR2, and VR3 are further illustrated in FIGS. 3A, 3B and 3C, respectively.

Figure 4:
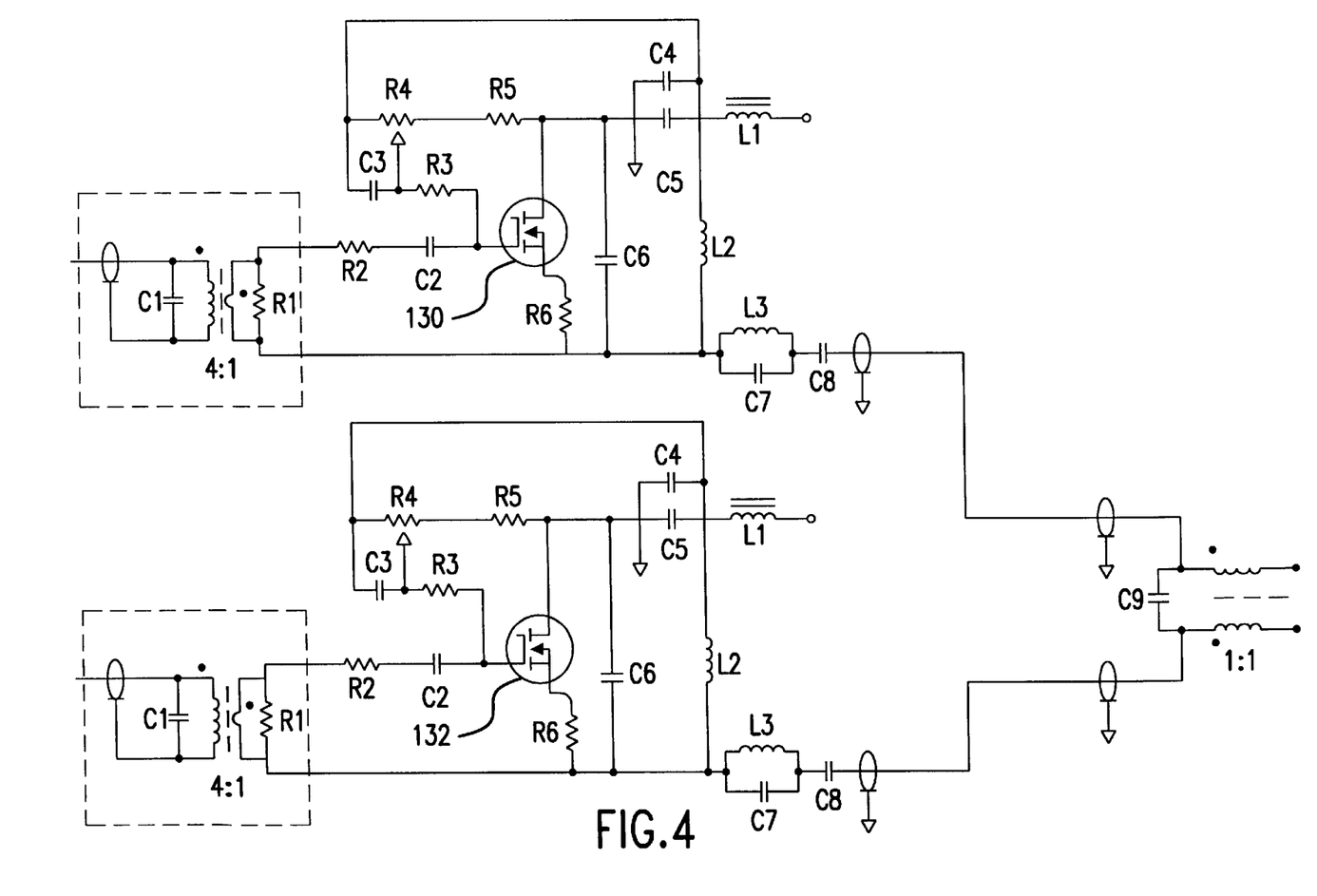
FIG. 4 is a schematic diagram of one embodiment of intermediate power amplifier (IPA).

FIG. 4 is a schematic diagram of one embodiment of intermediate power amplifier (IPA) 104. The preferred values for the various circuit elements will now be described. Impedance matching capacitor C1 is preferably 220 picofarads (pF). RF bypass and DC blocking capacitors C2, C3, and C4 are preferably 100 nanofarads (nF). Low frequency bypass capacitor C5 is preferably 1 microfarad (uF). L-C resonator capacitor C6 is preferably 100 pf Secondary L-C resonator capacitors C7 and C8 are preferably 68 pF and 470 pF, respectively. Impedance matching capacitor C9 is preferably 330 pF.

Termination resistor R1 is preferably 10 ohms. Isolation resistor R2 is preferably 2 ohms. DC bias isolation resistor R3 is preferably 1 kilo-ohms. Bias adjustment potentionometer R4 is preferably 20 K ohms and bias source resistor R5 is preferably 47 K ohms. Negative DC/RF feedback resistor R6 is preferably 3 ohms. RF choke inductor L1 is preferably 56 uH. Resonator inductor L2 is preferably 560 nH. Resonator inductor L3 is preferably 390 nH.

Figure 5:
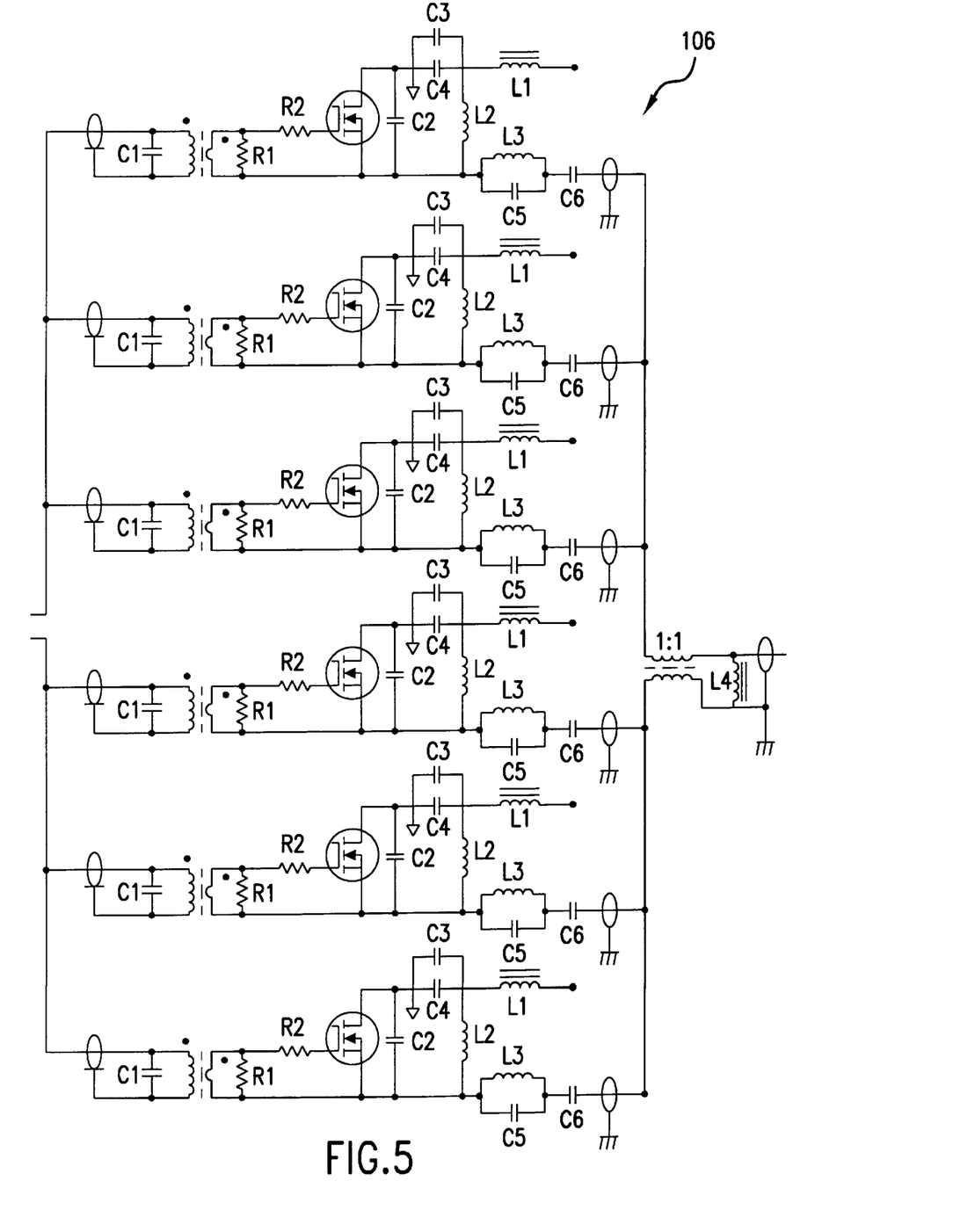
FIG. 5 is a schematic diagram of one embodiment of final power amplifier.

FIG. 5 is a schematic diagram of one embodiment of final power amplifier 106. Preferably, impedance matching capacitor C1 is 220 pF; resonator capacitor C2 is 100 pF; and RF bypass capacitor C3 is 100 nF. Preferably, low-frequency bypass capacitor C4 is 1 uF; L-C resonator capacitor C5 is 68 pF; and L-C resonator capacitor C6 is 200 pF. Preferably, termination resistor R1 is 10 ohms and isolation resistor R2 is 2 ohms. Preferably, RF choke inductor L1 is 56 uH; L-C resonator inductor L2 is 10.6 uH; L-C resonator inductor L3 is 0.8 uH and RF choke inductor L4 is 27 uH.

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. An amplifier, with an instantaneous bandwidth of two-thirds of an octave in the middle high frequency RF spectrum between 3 MHz and 30 MHz and with greater than 80% power conversion efficiency, for producing a multiple kilowatt continuous wave amplitude RF signal while operating directly from a variable, high voltage, DC power source that provides between about 100 to 200 VDC depending on a selected power amplitude, comprising:

a first group of two or more high conductivity, high breakdown voltage, discrete transistors connected substantially in parallel and isolated from each other by independent circuits connected at their input and output terminals; and a second group of two or more high conductivity, high breakdown voltage, discrete transistors connected substantially in parallel and isolated from each other by independent circuits connected at their input and output terminals, wherein said first group and said second group are combined so that each group conducts on opposite half cycles of an input RF signal, thereby permitting push-pull operation of the amplifier, and each of said discrete transistors has a grounded drain, common source configuration.

2. The amplifier of claim 1, wherein said discrete transistors are discrete packaged available DC-market type transistors.

3. The amplifier of claim 1, wherein said transistors are in a TO-247 package.

4. The amplifier of claim 1, wherein each of said discrete transistors is a bipolar junction transistor.

5. The amplifier of claim 1, wherein each of said discrete transistors is an insulated gate bipolar transistor.

6. The amplifier of claim 1, wherein each of said discrete transistors is a field effect transistor.

7. The amplifier of claim 6, wherein each of said discrete transistors is a metal-oxide silicon field effect transistor (MOSFET).

8. The amplifier of claim 1, wherein each of said independent circuits connected to said output terminals of said first group of transistors comprises a parallel resonant L-C resonator circuit connected in series with a series resonant L-C resonator circuit.

9. An amplifier, with an instantaneous bandwidth of two-thirds of an octave in the middle high frequency RF spectrum between 3 MHz and 30 MHz and with greater than 80% power conversion efficiency, for producing a multiple kilowatt continuous wave amplitude RF signal while operating directly from a variable, high voltage, DC power source that provides between about 100 to 200 VDC depending on a selected power amplitude, comprising:

a first group of two or more high conductivity, high breakdown voltage, discrete transistors connected substantially in parallel and isolated from each other by independent circuits connected at their input and output terminals; and a second group of two or more high conductivity, high breakdown voltage, discrete transistors connected substantially in parallel and isolated from each other by independent circuits connected at their input and output terminals, wherein said first group and said second group are combined so that each group conducts on opposite half cycles of an input RF signal, thereby permitting push-pull operation of the amplifier, and each of said independent circuits connected to said output terminals of said first group of transistors comprises a parallel resonant L-C resonator circuit connected in series with a series resonant L-C resonator circuit.

10. The amplifier of claim 9, wherein said discrete transistors are discrete packaged available DC-market type transistors.

11. The amplifier of claim 9, wherein said transistors are in a TO-247 package.

12. The amplifier of claim 9, wherein each of said discrete transistors is a bipolar junction transistor.

13. The amplifier of claim 9, wherein each of said discrete transistors is an insulated gate bipolar transistor.

14. The amplifier of claim 9, wherein each of said discrete transistors is a field effect transistor.

15. The amplifier of claim 14, wherein each of said discrete transistors is a metal-oxide silicon field effect transistor (MOSFET).

16. The amplifier of claim 9, wherein each of said discrete transistors has a grounded drain, common source configuration.

17. A wideband, multi-kilowatt, high efficiency, quasi-linear, HF power amplifier, comprising:

a final power amplifier, with an instantaneous bandwidth of two-thirds of an octave in the middle high frequency RF spectrum between 3 MHz and 30 MHz and with greater than 80% power conversion efficiency, for amplifying an input RF signal to a multiple kilowatt continuous wave amplitude RF signal while operating directly from a variable, high voltage, DC power source that provides between about 100 to 200 VDC depending on a selected power amplitude; and a driver amplifier and intermediate power amplifier (IPA) for providing said input RF signal to said final power amplifier, wherein said final power amplifier comprises:

a first group of two or more high conductivity, high breakdown voltage, discrete transistors connected substantially in parallel and isolated from each other by independent circuits connected at their input and output terminals; and a second group of two or more high conductivity, high breakdown voltage, discrete transistors connected substantially in parallel and isolated from each other by independent circuits connected at their input and output terminals, wherein said first group and said second group are combined so that each group conducts on opposite half cycles of said input RF signal, thereby permitting push-pull operation of the final power amplifier, and each of said discrete transistors has a grounded drain, common source configuration.

18. The power amplifier of claim 17, wherein said discrete transistors are discrete packaged available DC-market type transistors.

19. The power amplifier of claim 18, wherein said transistors are in a TO-247 package.

20. The power amplifier of claim 17, wherein each of said discrete transistors is a bipolar junction transistor.

21. The power amplifier of claim 17, wherein each of said discrete transistors is an insulated gate bipolar transistor.

22. The power amplifier of claim 17, wherein each of said discrete transistors is a field effect transistor.

23. The power amplifier of claim 22, wherein each of said discrete transistors is a metal-oxide silicon field effect transistor (MOSFET).

24. The power amplifier of claim 17, wherein said driver amplifier has two stages of amplification, the first stage comprising a high gain, class A bipolar transistor, and the second stage comprising a class A, bipolar, discrete transistor operating as a power limiter.

25. The power amplifier of claim 17, wherein the IPA comprises two high breakdown voltage transistors operating at a voltage less than about 100 VDC.

26. The power amplifier of claim 25, wherein said high breakdown voltage transistors are MOSFETS.

27. The power amplifier of claim 26, wherein said MOSFETS are configured in a DC grounded-drain, RF common source circuit configuration.

28. The power amplifier of claim 17, wherein each of said independent circuits connected to said output terminals of said first group of transistors comprises a parallel resonant L-C resonator circuit connected in series with a series resonant L-C resonator circuit.

29. A wideband, multi-kilowatt, high efficiency, quasi-linear, HF power amplifier, comprising:

a final power amplifier, with an instantaneous bandwidth of two-thirds of an octave in the middle high frequency RF spectrum between 3 MHz and 30 MHz and with greater than 80% power conversion efficiency, for amplifying an input RF signal to a multiple kilowatt continuous wave amplitude RF signal while operating directly from a variable, high voltage, DC power source that provides between about 100 to 200 VDC depending on a selected power amplitude;

a driver amplifier and intermediate power amplifier (IPA) for providing said input RF signal to said final power amplifier, wherein said driver amplifier has two stages of amplification, the first stage comprising a high gain, class A bipolar transistor, and the second stage comprising a class A, bipolar, discrete transistor operating as a power limiter, and said final power amplifier comprises:

a first group of two or more high conductivity, high breakdown voltage, discrete transistors connected substantially in parallel and isolated from each other by independent circuits connected at their input and output terminals; and a second group of two or more high conductivity, high breakdown voltage, discrete transistors connected substantially in parallel and isolated from each other by independent circuits connected at their input and output terminals, wherein said first group and said second group are combined so that each group conducts on opposite half cycles of said input RF signal, thereby permitting push-pull operation of the final power amplifier.

30. The power amplifier of claim 29, wherein said discrete transistors are discrete packaged available DC-market type transistors.

31. The power amplifier of claim 30, wherein said transistors are in a TO-247 package.

32. The power amplifier of claim 29, wherein each of said discrete transistors is a bipolar junction transistor.

33. The power amplifier of claim 29, wherein each of said discrete transistors is an insulated gate bipolar transistor.

34. The power amplifier of claim 29, wherein each of said discrete transistors is a field effect transistor.

35. The power amplifier of claim 34, wherein each of said discrete transistors is a metal-oxide silicon field effect transistor (MOSFET).

36. The power amplifier of claim 29, wherein each of said discrete transistors has a grounded drain, common source configuration.

37. The power amplifier of claim 29, wherein the IPA comprises two high breakdown voltage transistors operating at a voltage less than about 100 VDC.

38. The power amplifier of claim 37, wherein said high breakdown voltage transistors are MOSFETS.

39. The power amplifier of claim 38, wherein said MOSFETS are configured in a DC grounded-drain, RF common source circuit configuration.

40. The power amplifier of claim 29, wherein each of said independent circuits connected to said output terminals of said first group of transistors comprises a parallel resonant L-C resonator circuit connected in series with a series resonant L-C resonator circuit.

41. A wideband, multi-kilowatt, high efficiency, quasi-linear, HF power amplifier, comprising:

a final power amplifier, with an instantaneous bandwidth of two-thirds of an octave in the middle high frequency RF spectrum between 3 MHz and 30 MHz and with greater than 80% power conversion efficiency, for amplifying an input RF signal to a multiple kilowatt continuous wave amplitude RF signal while operating directly from a variable, high voltage, DC power source that provides between about 100 to 200 VDC depending on a selected power amplitude; and a driver amplifier and intermediate power amplifier (IPA) for providing said input RF signal to said final power amplifier, wherein said IPA comprises two high breakdown voltage transistors operating at a voltage less than about 100 VDC, each of said two high breakdown voltage transistors being configured in a DC grounded-drain, RF common source circuit configuration, and said final power amplifier comprises:

a first group of two or more high conductivity, high breakdown voltage discrete transistors connected substantially in parallel and isolated from each other by independent circuits connected at their input and output terminals; and a second group of two or more high conductivity, high breakdown voltage discrete transistors connected substantially in parallel and isolated from each other by independent circuits connected at their input and output terminals, wherein said first group and said second group are combined so that each group conducts on opposite half cycles of said input RF signal, thereby permitting push-pull operation of the final power amplifier.

42. The power amplifier of claim 41, wherein said discrete transistors are discrete packaged available DC-market type transistors.

43. The power amplifier of claim 42, wherein said transistors are in a TO-247 package.

44. The power amplifier of claim 41, wherein each of said discrete transistors is a bipolar junction transistor.

45. The power amplifier of claim 41, wherein each of said discrete transistors is an insulated gate bipolar transistor.

46. The power amplifier of claim 41, wherein each of said discrete transistors is a field effect transistor.

47. The power amplifier of claim 46, wherein each of said discrete transistors is a metal-oxide silicon field effect transistor (MOSFET).

48. The power amplifier of claim 41, wherein each of said discrete transistors has a grounded drain, common source configuration.

49. The power amplifier of claim 41, wherein said driver amplifier has two stages of amplification, the first stage comprising a high gain, class A bipolar transistor, and the second stage comprising a class A, bipolar, discrete transistor operating as a power limiter.

50. The power amplifier of claim 41, wherein each of said independent circuits connected to said output terminals of said first group of transistors comprises a parallel resonant L-C resonator circuit connected in series with a series resonant L-C resonator circuit.

51. A wideband, multi-kilowatt, high efficiency, quasi-linear, HF power amplifier, comprising:

a final power amplifier, with an instantaneous bandwidth of two-thirds of an octave in the middle high frequency RF spectrum between 3 MHz and 30 MHz and with greater than 80% power conversion efficiency, for amplifying an input RF signal to a multiple kilowatt continuous wave amplitude RF signal while operating directly from a variable, high voltage, DC power source that provides between about 100 to 200 VDC depending on a selected power amplitude; and a driver amplifier and intermediate power amplifier (IPA) for providing said input RF signal to said final power amplifier, wherein said final power amplifier comprises:

a first group of two or more high conductivity, high breakdown voltage discrete transistors connected substantially in parallel and isolated from each other by independent circuits connected at their input and output terminals; and a second group of two or more high conductivity, high breakdown voltage discrete transistors connected substantially in parallel and isolated from each other by independent circuits connected at their input and output terminals, wherein said first group and said second group are combined so that each group conducts on opposite half cycles of said input RF signal, thereby permitting push-pull operation of the final power amplifier, and each of said independent circuits connected to said output terminals of said first group of transistors comprises a parallel resonant L-C resonator circuit connected in series with a series resonant L-C resonator circuit.

52. The power amplifier of claim 51, wherein said discrete transistors are discrete packaged available DC-market type transistors.

53. The power amplifier of claim 52, wherein said transistors are in a TO-247 package.

54. The power amplifier of claim 51, wherein each of said discrete transistors is a bipolar junction transistor.

55. The power amplifier of claim 51, wherein each of said discrete transistors is an insulated gate bipolar transistor.

56. The power amplifier of claim 51, wherein each of said discrete transistors is a field effect transistor.

57. The power amplifier of claim 56, wherein each of said discrete transistors is a metal-oxide silicon field effect transistor (MOSFET).

58. The power amplifier of claim 51, wherein each of said discrete transistors has a grounded drain, common source configuration.

59. The power amplifier of claim 51, wherein said driver amplifier has two stages of amplification, the first stage comprising a high gain, class A bipolar transistor, and the second stage comprising a class A, bipolar, discrete transistor operating as a power limiter.

60. The power amplifier of claim 51, wherein the IPA comprises two high breakdown voltage transistors operating at a voltage less than about 100 VDC.

61. The power amplifier of claim 60, wherein said high breakdown voltage transistors are MOSFETS.

62. The power amplifier of claim 61, wherein said MOSFETS are configured in a DC grounded-drain, RF common source circuit configuration.

* * * * *